United States Patent

[11] 3,582,610

[72] Inventor Paul N. Eckles
Carmichael, Calif.
[21] Appl. No. 827,779
[22] Filed May 26, 1969
[45] Patented June 1, 1971
[73] Assignee Aerojet-General Corporation
El Monte, Calif.

[54] FLAT PACK HEATER
4 Claims, 6 Drawing Figs.

[52] U.S. Cl. ........ 219/209, 219/85, 219/535
[51] Int. Cl. ........ H05b 1/00
[50] Field of Search ........ 219/85, 158, 209, 243, 236, 535, 536; 228/19; 269/289; 29/203

[56] References Cited

UNITED STATES PATENTS

| | | | |
|---|---|---|---|
| 2,782,782 | 2/1957 | Taylor | 126/374 |
| 3,313,919 | 4/1967 | Richardson et al. | 219/433 |
| 3,432,641 | 3/1969 | Welke | 219/433 |
| 1,983,970 | 12/1934 | Decker | 219/535 |
| 2,001,538 | 5/1935 | Mueller et al. | 219/236 |
| 2,288,464 | 6/1942 | Kitchener | 219/535 |
| 3,084,649 | 4/1963 | Parstorfer | 219/85UX |
| 3,230,338 | 1/1966 | Kawecki | 219/85 |

FOREIGN PATENTS

| | | | |
|---|---|---|---|
| 1,564,832 | 3/1969 | France | 219/85 |

OTHER REFERENCES

F. J. Kurtz, IBM Technical Disclosure Bulletin, Joining Semiconductor Chips to a Decal Interconnection Overlay, Vol. 11, No. 3, August 1968, page 309 & 310.

*Primary Examiner*—J. V. Truhe
*Assistant Examiner*—C. L. Albritton
*Attorneys*—Edward O. Ansell and D. Gordon Angus

ABSTRACT: Flat packs are soldered to circuit boards by holding their flat terminal tabs to the mating parts of the circuit on the board after solder has been applied to the parts of the tabs adjacent the board, and the opposite sides of the tabs are pressed against a heated rim or rims of a heater long enough to reflow the solder so that the solder from each terminal tab envelops its mating part on the circuit board, after which the terminal tabs are moved out of heating relationship with the hot rim to allow the solder to cool and solidify.

INVENTOR.
PAUL N. ECKLES
BY
D. Gordon Angus
ATTORNEY

INVENTOR.
PAUL N. ECKLES
BY
[signature]
ATTORNEY

FLAT PACK HEATER

SPECIFICATION This invention relates to method and means for applying localized heat to devices for periods of time.

An object of this invention is to apply instantaneous and uniform heat over a limited area.

A related object is to apply pressure to the thing being heated at the same time as the heat application.

The invention is particularly applicable to the reflow soldering of flat pack circuits to printed circuit boards, and an object in this respect is to provide an accurate means for making such soldered joints. A related object is to enable a complete unit or board to be soldered in a single operation.

Heretofore in the soldering of components to circuit boards as by spot welders, a problem has been that each leg or tab must be located by the operator, often requiring the use of binoculars for small components. This labor has been an important factor, and furthermore failures have been incurred due to variations in the operation. It has been the experience in such commercial operations that many terminal tabs of components may become bent away from their mating parts on the board, and soldering alloy may melt, but not flow properly to make a complete joint.

In accordance with the present invention, there is provided a heating means and method which is useful in such operations as the soldering of electronic components, such as those known as flat packs, to printed circuit boards. Such flat packs commonly comprise circuit components held in fixed relation to each other and provided with terminal tabs which generally lie in a plane. The arrangement is such that the terminal tabs can be caused to correlate precisely with mating parts of a printed circuit board to which the tabs of the flat pack are to be joined by solder. For the purpose of making the joint, the terminals are generally precoated with the solder so that the joint can be readily effected by pressing the tabs against the mating part of the circuit printed on the board.

The invention is carried out by provision of a heat block provided with a recess or opening to receive a heating element, preferably a heat lamp arrangement and a bar or rim means in heat-conductive relationship with the block. The bar or rim means can be placed in heat-conductive relationship with one side of the terminal tabs carrying the solder so that the tabs can be pressed between the rim and the circuit board. Heating by the heating element produces immediate heating of the block with heat flow to the bar or rim means. This will cause the solder already on the tab to reflow in a very short time such as a matter of seconds, and the reflow of the solder together with the pressure applied causes the solder to join the tabs to the mating parts on the board. Upon removal of the solder joint from the heat, solidification of the solder takes place, producing a firm joint.

A feature of the invention resides in the pressing of the solder-coated tabs between the board and the heating bar means with enough pressure and heat to reflow the solder within a very short time.

An optional and desirable feature resides in the provision of spring means functioning to separate the heating rim or bar means from the tabs when sufficient heat has been applied to reflow the solder, thereby allowing the solder to cool again to solidify the joint.

Other features reside in means and method for joining numbers of flat packs to a circuit board simultaneously.

The foregoing and other features of the invention will be better understood from the following detailed description and the accompanying drawings, of which:

Figure 1:
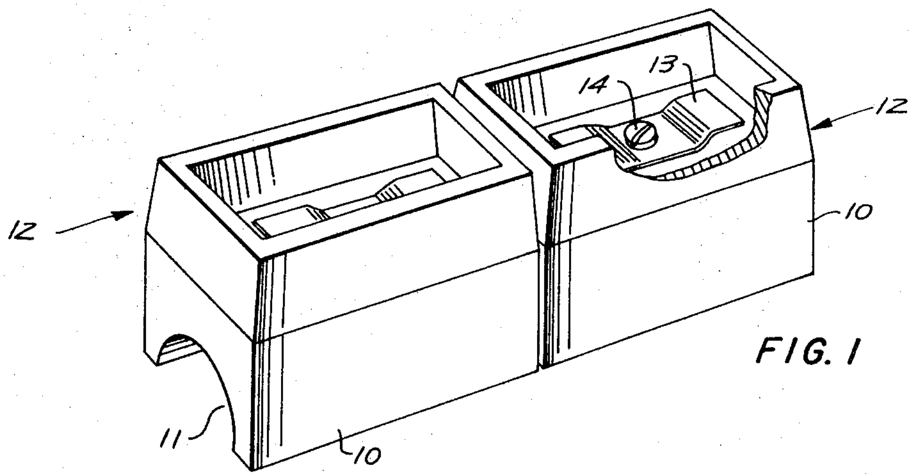
FIG. 1 shows heating units according to this invention.

Referring to the drawings, FIG. 1 shows two heating units, according to this invention each comprising a heat block 10 in the form of a solid unitary block of heat-conductive material, ordinarily aluminum, the underside of which is recessed longitudinally at 11, of sufficient dimensions to receive a heating lamp (not shown in FIG. 1). There is placed on top of the block 10 a rim member in the form of a socket 11 of a heat-conducting material, also ordinarily of aluminum, formed by four sides of dimensions substantially the same as the dimensions of the four sides of the block 10, so that the socket 11 fits the top of the block. If desired, the socket 11 can be locked to the block by locking means (not shown). The heating unit at the right of FIG. 1 shows the rim member partially broken away to better reveal the top of block 10 and a spring member 13 fastened to the top of the block by a screw 14. The spring member 13 is made of a bimetallic strip of metal designed so that the outer ends will move upwardly when heated and relax to a position closer to the top of block 10 when cooled.

Figure 2:
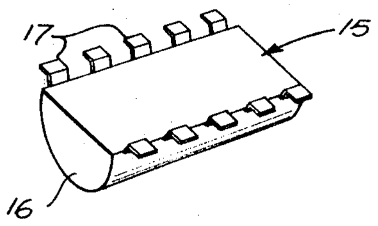
FIG. 2 shows a flat pack adapted to be heated by a heater according to FIG. 1.

The flat pack shown in FIG. 2 comprises circuit elements or components held in position within a solid envelope 16. The components themselves, being covered by the envelope are not shown, but their terminal tabs 17 are shown protruding from respective components for connection with circuitry on a circuit board. A circuit board commonly comprises circuitry printed in a substrate in some manner so that the substrate with its circuitry lies in a plane. The terminal tabs 17 of the flat pack lie so that the horizontal ends of the tabs also lie in a plane on mating parts of the circuitry of the board. The dimensions of the unit 15 are such that the tabs 17 will lie along the respective opposite rims of a bar member 12 of the heater.

The heating element for each heater is an elongated heater lamp ordinarily of the tungsten filament/quartz envelope type which is capable of radiating a great amount of infrared radiation which will permeate immediately throughout the aluminum block 10 and rim 12.

Figure 3:
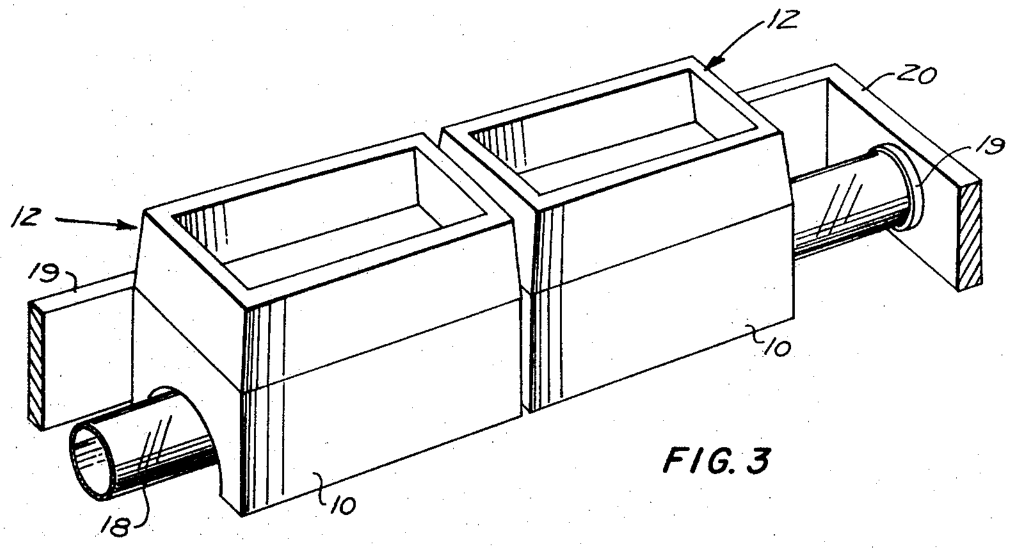
FIG. 3 shows a multiple heater arrangement according to this invention with a common heating lamp.

FIG. 3 shows how a plurality of the heating units can be serviced by a single elongated heater lamp 18 suitable powered from an electrical power source (not shown). A side board 19 serves to keep the plurality of units aligned so that the lamp will pass through the bottom recesses of all of them, the base of the lamp being threaded into a suitable electric power socket 30 attached to an end member 20 of the frame.

Figure 4:
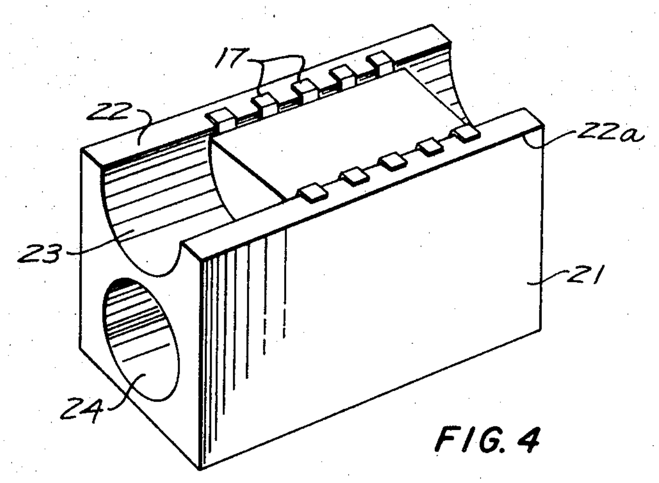
FIG. 4 shows a flat pack according to FIG. 2 in heating relation with a heating unit according to this invention.

The use of the rim 12 separate from the block 10 provides a degree of versatility for the block, for it is possible to place on the block a rim member which varies somewhat in dimensions from that illustrated in the FIGS. 1 and 3, for the purposes of accommodating different arrangements of units such as 15. It is not essential, however, to provide a rim separate from the heater block. FIG. 4 shows such an arrangement in which the heater block 21 includes its own rim 22 as an integral construction, the two opposite rims 22 and **22*a* being formed by a recess 23 extending longitudinally along the upper surface of the block, of sufficient depth and dimensions to receive the flat pack 15 with the terminal tabs rested on the tops of the opposite rims. A cylindrical bore or opening 24** extends longitudinally through the block to accommodate the heat lamp, which will extend through it.

The upper flat surfaces of the tabs 17 with reference to FIGS. 2 and 4 are presoldered prior to placing on the heating block. For the purpose of attaching the flat pack to a circuit board, the circuit board shown as board 25 in FIG. 5 and carrying circuits shown at 26 which may be formed on the board in any well-known manner, and having a suitable terminal part 27 also formed on the board, is placed over the tabs 17 resting on the heater element with the side of the board carrying the circuitry downward and joints 27 placed on respective tabs 17. With downward pressure applied to the board, the electric power will be turned on the heating lamp, the heat from which, permeating through the heat block, will heat the terminal tabs sufficiently to reflow the solder on the tab surfaces causing it to merge and form a joint with the mating members 27 of the circuit board. The time of such heating ordinarily need be only a few seconds to produce sufficient solder flow, after which the unit 15 with the circuit board should be lifted from the heat block to allow the solder to solidify again by cooling.

When the arrangement of FIG. 1 is used instead of FIG. 4, the flat pack 15 will be placed on the rim similar to that shown in FIG. 4. The position of the spring ends is such that when the solder is cool, the spring ends 13 lie slightly below the flat pack 16, or at least do not exert sufficient upward pressure to lift the flat pack. But when the interior within the rim heats up as when the solder melts, the bimetallic spring members exert greater upward lift, raising the flat pack 15 and the tabs 17 up from the rim, thereby allowing the reflowed solder to solidify to the respective joints of the circuit board.

Figure 6:
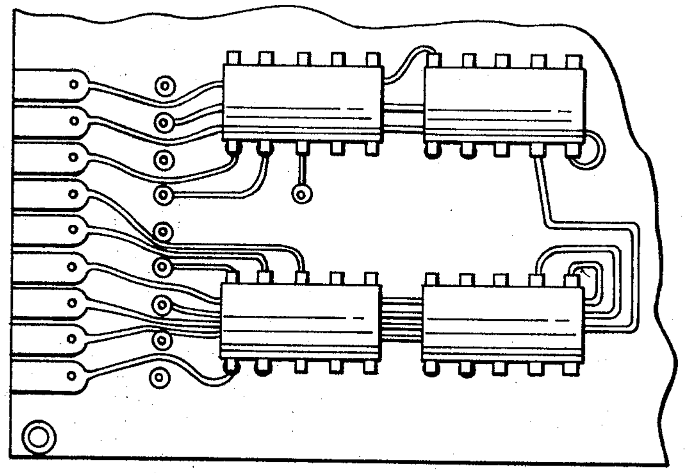
FIG. 6 shows multiple flat packs soldered on a circuit board by use of heating according to this invention.

By use of the present invention, many different flat packs such as 15 can be attached by solder to circuit boards simultaneously. An arrangement for doing this is illustrated in FIG. 6, which represents a corner of a relatively large circuit board adapted to contain circuitry and may flat packs such as 15. For this purpose it is desirable that the circuit board arrangement be such that the plurality of flat packs will be placed relative to the board along straight lines as shown in FIG. 6. In this way, arrangements such as those of FIG. 1 and 3 may be used along each line of flat pack units, and it will be understood that more than two heating units may be aligned depending on the number of flat pack units in the line. The circuit board can be properly positioned in any suitable manner in a mechanism to be brought down with pressure on the tabs of the several flat packs for soldering.

In FIGS. 1 to 4 the heating rims of the heating units are shown facing upward and the flat packs are shown in inverted position. This will require that the circuit boards correspondingly be inverted to mate with the flat packs. This represents one method of performing the operation, and the method is well suited to use of suitable holding mechanism for holding the flat pack in its proper position on the circuit board, and then bringing the flat pack with the board down in the heated rims with the board and flat pack in inverted position, for the period of time required to reflow the solder, after which the flat pack and attached board will be lifted from the rims.

Figure 5:
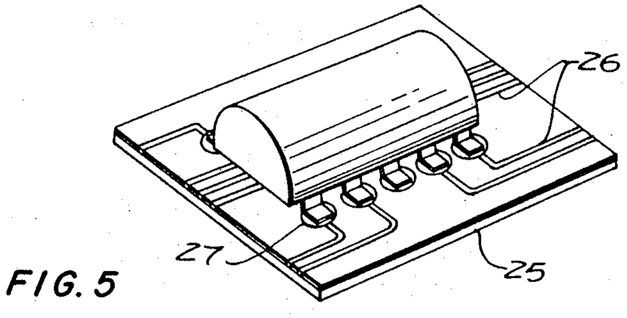
FIG. 5 shows a flat pack according to FIG. 2 after being soldered to a circuit board by application of heat.

An alternative method is to perform the operation with the board and flat top in upright position as shown in FIG. 5, in which case the heating unit will be inverted relative to the positions shown in FIGS. 1, 3 and 4, so that the rim will come down on top of the tabs of the flat packs for the period of time required for solder reflow, after which the heating unit and rims will be lifted. It will be recognized that suitable holding mechanism can be utilized for handling the heating unit in this manner. Whichever method is used, it is desired that the bringing together of the flat pack and the heating rims shall be attended by a positive controlled pressure between the board, the tabs, and the heating rims.

Various expedients for rapid chilling of the solder after the reflow will suggest themselves, for example, the application of air jets upon discontinuance of the heating of the terminal tabs. It will be recognized also that such expedients as thermally operated switches may be used with the electric power system for the heating lamps, which will turn on and off the lamps according to the temperature in the region of the flat packs between the heating rims.

It will be recognized that the method illustrated and described above literally lends itself to precisely placing the flat packs in their proper positions on the board and bringing the board and flat pack combination to the heating elements.

I claim:

1. A heater for applying heat to a plurality of terminals of a flat pack simultaneously, comprising:

a heat source;

a block having a pair of interstices, the first for containment of said heat source and the second for containment of the flat pack and having a rim for contact with the terminals; and a temperature-sensitive device within the heater to vary the pressure of the rim of the second interstice of said block against the terminals of the flat pack in proportion to heat received by the terminals of the flat pack.

2. The heater of claim 1 in which said temperature-sensitive device comprises a bimetal spring.

3. The heater of claim 1 in which said temperature-sensitive device is contained in the second interstice of said block.

4. The heater of claim 1 in which the interstices of said block are in containers separable from each other.